(12) United States Patent
Rozenblat et al.

(10) Patent No.: US 8,810,033 B2
(45) Date of Patent: Aug. 19, 2014

(54) BARRIER LAYER FOR INTEGRATED CIRCUIT CONTACTS

(71) Applicant: Micron Technology, Inc., Boise, ID (US)

(72) Inventors: Avraham Rozenblat, Tel Aviv (IL); Shai Haimson, Moshav Beer Ruvia (IL); Rotem Drori, Modiin (IL); Maor Rotlain, Qiryat Gat (IL); Dror Horvitz, Moshav Bear Tuvia (IL)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/890,023

(22) Filed: May 8, 2013

(65) Prior Publication Data

US 2013/0241066 A1   Sep. 19, 2013

Related U.S. Application Data

(62) Division of application No. 13/083,868, filed on Apr. 11, 2011, now Pat. No. 8,461,043.

(51) Int. Cl.
*H01L 29/40* (2006.01)
*H01L 23/52* (2006.01)
*H01L 23/48* (2006.01)

(52) U.S. Cl.
USPC ............... 257/751; 257/E21.584; 257/758; 257/774; 438/627; 438/643

(58) Field of Classification Search
CPC .............. H01L 21/76843; H01L 23/53238
USPC .......... 257/E21.021, E29.157, 757, 751, 758, 257/760, 762, 763, 764, E21.584, E23.011, 257/767–769, 774–776, 786; 438/653, 643, 438/627, 927, 618, 629, 648, 672, 675, 687
See application file for complete search history.

(56) References Cited

U.S. PATENT DOCUMENTS

| | | | |
|---|---|---|---|
| 4,833,519 A | 5/1989 | Kawano | |
| 4,884,123 A | 11/1989 | Dixit | |
| 4,926,237 A * | 5/1990 | Sun et al. | 257/764 |
| 4,965,656 A | 10/1990 | Koubuchi | |
| 5,700,716 A * | 12/1997 | Sharan et al. | 438/630 |
| 5,821,168 A | 10/1998 | Jain | |
| 5,977,636 A * | 11/1999 | Sharan | 257/763 |
| 6,103,569 A | 8/2000 | Teo | |
| 6,274,899 B1 | 8/2001 | Melnick | |
| 6,281,127 B1 | 8/2001 | Shue | |

(Continued)

OTHER PUBLICATIONS

Lamborn, et al., "Modeling studies of the chemical vapor deposition of boron films from B2H6", Journal of Crystal Growth, vol. 299, Nov. 2006, 358-364.

(Continued)

*Primary Examiner* — Chris Chu
(74) *Attorney, Agent, or Firm* — Dorsey & Whitney LLP

(57) ABSTRACT

Plug contacts may be formed with barrier layers having thicknesses of less than 50 Å in some embodiments. In one embodiment, the barrier layer may be formed by the chemical vapor deposition of diborane, forming a boron layer between a metallic contact and the surrounding dielectric and between a metallic contact and the substrate and/or substrate contact. This boron layer may be substantially pure boron and boron silicide.

12 Claims, 2 Drawing Sheets

(56) References Cited

U.S. PATENT DOCUMENTS

| | | |
|---|---|---|
| 6,284,646 B1 | 9/2001 | Leem |
| 6,528,409 B1 | 3/2003 | Lopatin |
| 6,534,835 B2 * | 3/2003 | Farrar .................. 257/369 |
| 6,566,260 B2 | 5/2003 | Chooi et al. |
| 6,573,572 B2 * | 6/2003 | Farrar .................. 257/386 |
| 6,686,251 B2 | 2/2004 | Igarashi |
| 6,713,373 B1 | 3/2004 | Omstead |
| 6,746,952 B2 * | 6/2004 | Derraa et al. .................. 438/627 |
| 6,831,004 B2 | 12/2004 | Byun |
| 6,906,420 B2 * | 6/2005 | Harada .................. 257/754 |
| 7,061,111 B2 * | 6/2006 | McTeer .................. 257/751 |
| 7,154,178 B2 * | 12/2006 | Lin .................. 257/751 |
| 7,189,641 B2 | 3/2007 | Lee |
| 7,196,420 B1 * | 3/2007 | Burke et al. .................. 257/751 |
| 7,271,092 B2 | 9/2007 | Agarwal |
| 7,352,041 B2 | 4/2008 | Horikoshi |
| 7,422,979 B2 * | 9/2008 | Michaelson et al. .......... 438/643 |
| 7,425,506 B1 * | 9/2008 | Kailasam .................. 438/694 |
| 7,517,782 B2 * | 4/2009 | Preusse et al. .................. 438/597 |
| 7,576,006 B1 | 8/2009 | Yu |
| 7,875,939 B2 * | 1/2011 | Park et al. .................. 257/412 |
| 7,902,065 B2 * | 3/2011 | Kim et al. .................. 438/636 |
| 7,981,791 B2 * | 7/2011 | Haukka et al. .................. 438/627 |
| 8,173,537 B1 * | 5/2012 | Chattopadhyay et al. .... 438/618 |
| 2005/0191803 A1 * | 9/2005 | Matsuse et al. .................. 438/202 |
| 2012/0256317 A1 | 10/2012 | Rosenblat |

OTHER PUBLICATIONS

Sarubbi, et al., "Uniformity of Chemical Vapor Deposited Boron-Silicide Layers on Silicon", Laboratory of Electronic Components, Technology and Materials Delft University of Technology, Oct. 1, 2006.

\* cited by examiner

BARRIER LAYER FOR INTEGRATED CIRCUIT CONTACTS

CROSS-REFERENCE TO RELATED APPLICATION(S)

This application is a divisional of pending U.S. patent application Ser. No. 13/083,868, filed Apr. 11, 2011, which application is incorporated herein by reference, in its entirety, for any purpose.

BACKGROUND

This relates generally to integrated circuit fabrication and particularly to forming high aspect ratio contacts.

A plug or plug contact is a conductive region within a dielectric layer. It may be used to make electrical contact to a diffusion or a metallic interconnect as two examples.

A plug contact may be formed in a high aspect ratio via, opening, aperture or hole in a dielectric layer that is filled with a conductor, such as tungsten. As used herein, "high aspect ratio" means having a ratio of depth to width greater than 10. As used herein, an "aperture" includes a via, an opening, a contact, or a hole.

DETAILED DESCRIPTION

Because tungsten will not adhere well to silicon at the bottom of the via or the dielectric defining the via sidewalls, an adhesion layer of titanium nitride is commonly used to line the via. The titanium nitride layer also acts as a barrier layer to protect the contact at the bottom of the via from fluorine attack during subsequent tungsten deposition. A tungsten nucleation layer may be used to promote faster deposition on the conventional barrier material of titanium nitride with relatively low incubation time. Then tungsten chemical vapor deposition fill is used due to its good conductivity, Sometimes, at relatively small dimensions below 45 nanometers with aspect ratios above 1:10, incomplete deposition occurs inside the contact plug holes increasing contact resistance.

As dimensions shrink, vias become more challenging to fill with tungsten due to their high aspect ratio and small critical dimensions. The barrier and nucleation layers consume plug volume and lead to a significant decrease in the plug's top opening dimensions at manometric levels. A subsequent metal deposition is then severely limited due to this small via cross-sectional area. The small opening that remains after lining the via may result in reducing the effective conducting volume within the plug.

In accordance with some embodiments, the need for conventional plug contact barrier and adhesion layers, such as titanium nitride and tungsten nucleation layers may be reduced. As a result, the effective size of the aperture opening that is ultimately filled with plug material, such as tungsten, may be greater in some embodiments.

In particular, in some embodiments a plug or contact aperture may be conformally coated with a very thin boron layer.

In some embodiments, the boron layer may be less than 50 Angstroms in thickness. Because of the reduced thickness of the boron barrier layer, the effective aperture opening at the time of tungsten deposition may be larger.

In some embodiments, the boron layer may be selectively deposited only on the bottom of the aperture. Where the boron layer is selectively deposited only at the bottom of the aperture, the effective opening area for receiving a tungsten deposition is equivalent to the dimensions of the original aperture opening area.

This increased effective cross-sectional area at deposition time, is particularly advantageous in embodiments in which the aperture has a relatively high aspect ratio, for example, 1:10 or worse and with technologies with relatively small feature sizes such as 45 nanometers or less.

Figure 1:
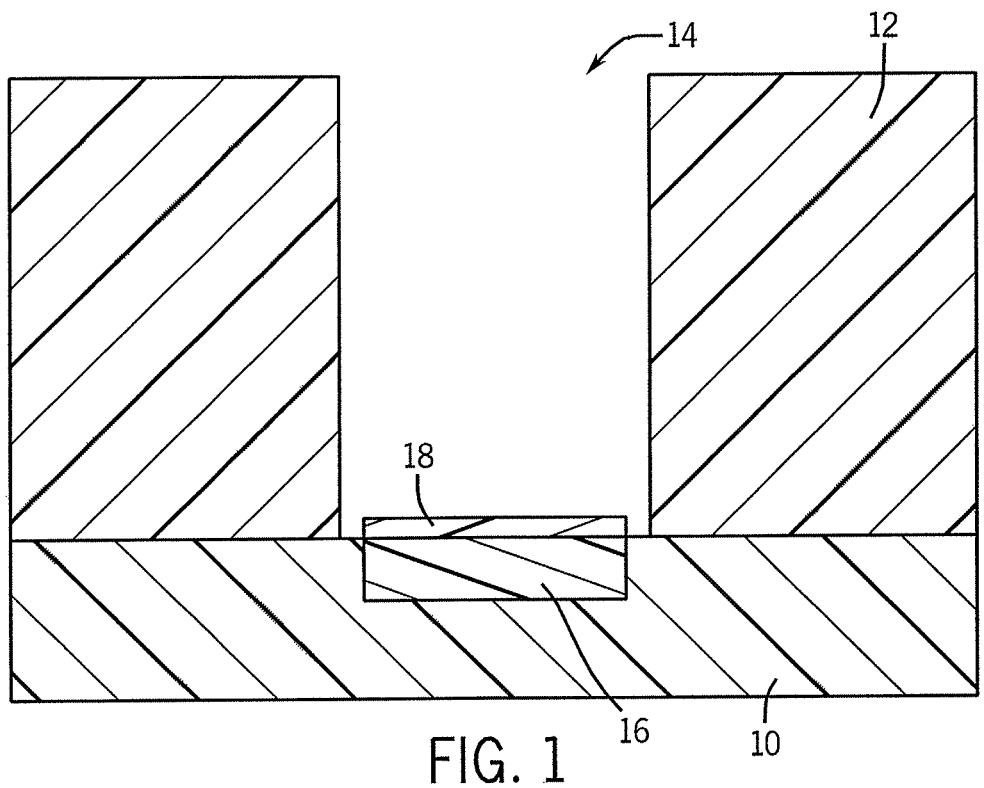
FIG. 1 is a greatly enlarged, cross-sectional view at an early stage of manufacture.

Referring to FIG. 1, an aperture 14 for a contact may be defined in a dielectric 12. A semiconductor substrate 10, under the dielectric 12, may have a contact 16 formed therein. In one embodiment, the contact 16 is titanium silicide and a titanium layer 18 is formed thereover. Commonly, the dielectric 12 is silicon dioxide but any dielectric may be utilized and other metals may be utilized for the contact 16. In addition, while a silicon substrate 10 is described, other semiconductor substrates may also be used In some embodiments, the aspect ratio of the aperture 14 may be 1:10 or greater and the feature size may be less than 45 nanometers.

Figure 2:
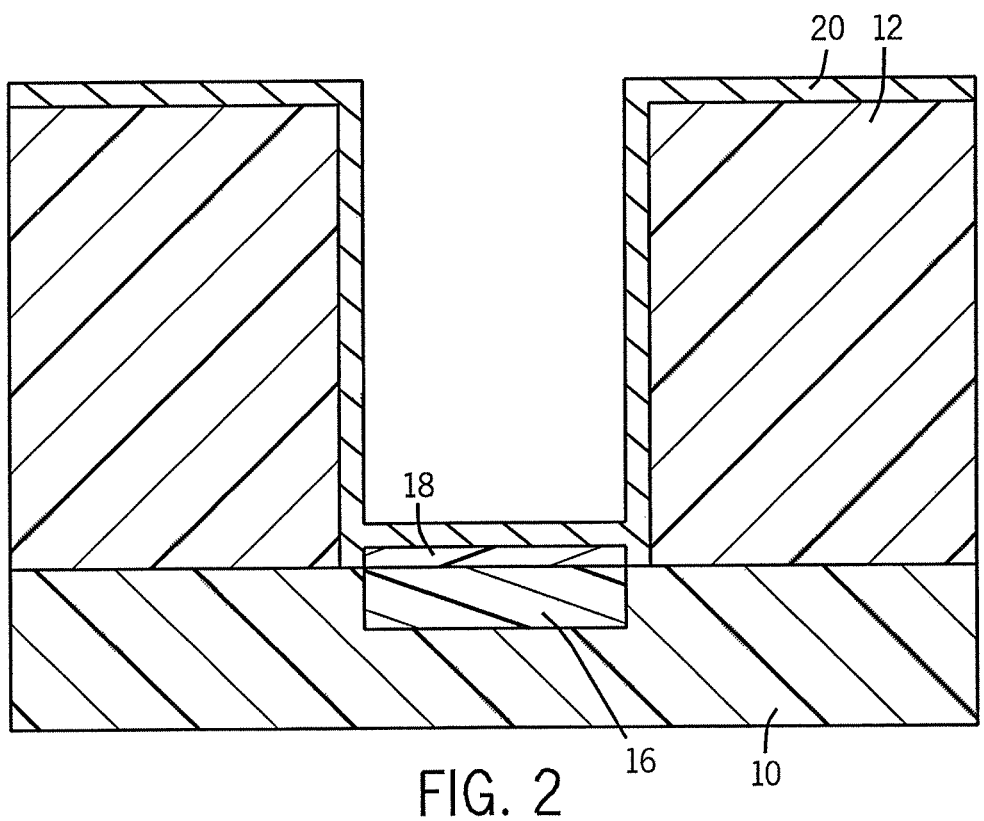
FIG. 2 is a greatly enlarged, cross-sectional view after the formation of a boron barrier layer in accordance with one embodiment.

Referring next to FIG. 2, a boron layer 20 may be formed on all the exposed surfaces in one embodiment. Those exposed surfaces in one embodiment may include the upper surface of the dielectric layer 12, the sidewalls of the aperture 14 made up of the dielectric layer 12 material, the titanium layer 18 or other metal and the exposed portion of the semiconductor substrate 10 between the dielectric layer 12 and the titanium layer 18.

The boron layer may be substantially only boron in one embodiment. In other embodiments, the boron layer is more than 50 atomic percent boron. The boron layer may physically contact both the dielectric and the contact.

In other embodiments, the boron layer 20 may be selectively formed substantially only at the bottom of the aperture by selecting the appropriate materials for the dielectric material 12 and the contact 18. Particularly, by selecting the materials so that there is a much greater deposition rate on certain materials compared to other exposed materials, selective deposition may be achieved. Other selective deposition techniques may also be used.

The boron layer 20 may, for example, be formed by the chemical vapor deposition of boron to form boron silicide on any exposed silicon surfaces. The source gas may be diborane, $B_2H_6$, which in one embodiment may be one percent $B_2H_6$ in hydrogen gas. The reactor pressure may, for example, be anywhere from about 50 to 800 Torr. The inlet flow rate, in one example, may be on the order of about 650 sccm. The inlet partial pressure of diborane may be from about 0.025 to 0.154 Torr, in one embodiment. The substrate temperature may be in the range of about 500 to 800° C. and the coil current may be about 300 amps, in one embodiment. In general, the formation of the boron layer is slower the lower the temperature and the lower the diborane partial pressure. In one embodiment, the diborane partial pressure is about $3.5 \times 10^{-3}$ Torr and a 760 Torr ambient.

In some embodiments, the boron layer 20 acts as a good barrier layer and a good adhesion layer for subsequent metal formation and plug or contact fill, particularly for plug or contact fills with tungsten. In some embodiments, the boron layer may entirely isolate and separate the metallic contact from the dielectric layer 12.

Thus, in some embodiments, the boron layer 20 may be made much thinner than conventional barrier layer compositions, such as those that include titanium nitride and tungsten nucleation layers. For example, in some embodiments, the boron layer 20 may have a thickness of less than 50 Angstroms.

In some embodiments, the only material between the dielectric layer 12 and the metal fill 22 is boron from the boron layer 20. That is, no other barrier or adhesion layers in addition to the boron layer 20 may be used in some embodiments. However in other embodiments, a thin boron layer may be accompanied by additional layers but these may have the effect of decreasing the effective via opening area at fill time.

The composition of the boron layer 20 in some embodiments may be substantially pure amorphous boron and, at the interface between substantially pure boron layer and the substrate, boron silicide, in embodiments where the substrate is silicon.

Figure 3:
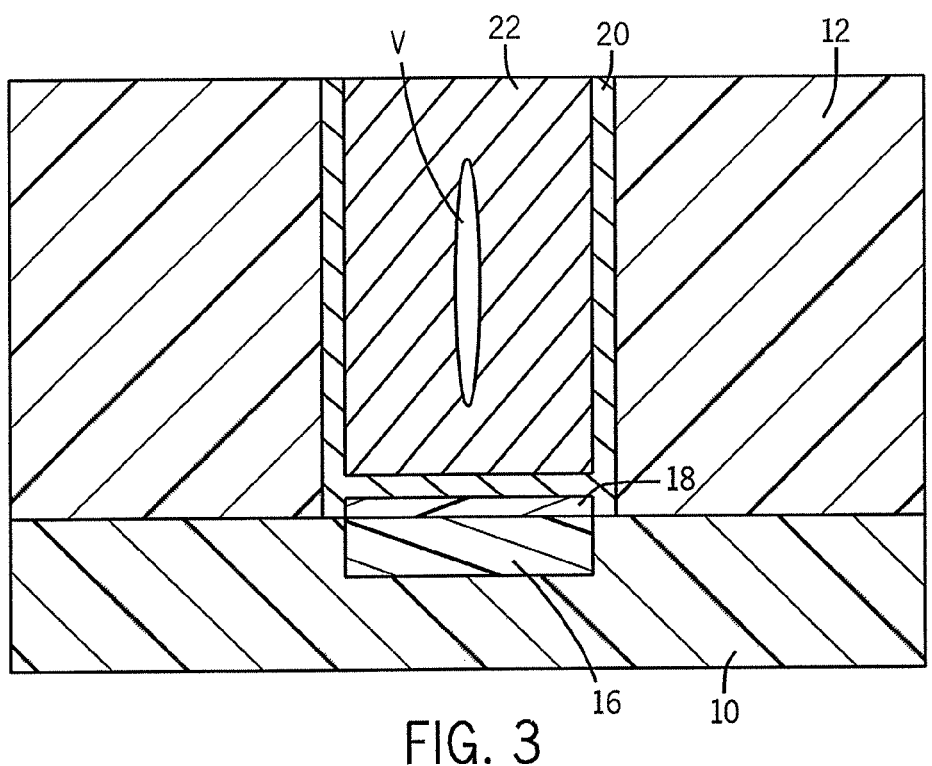
FIG. 3 is a greatly enlarged, cross-sectional view of the plug contact after being filled and planarized.

Turning to FIG. 3, after formation of the boron layer 20, a conductive fill 22 may be, for example, a tungsten chemical vapor deposition. The structure may then be planarized to form the structure shown. In some embodiments, the creation of a void V may be reduced or even eliminated. Because of the smaller thickness of the layer 20 in some embodiments, the effective aperture opening area as seen by the tungsten fill process is greater. This facilitates application to technologies with small feature sizes and large aspect ratio contacts and plugs. In addition, the boron layer protects the silicon substrate and the layer 18 from fluorine attack during the tungsten chemical vapor deposition in some embodiments. Boron also acts as an effective adhesion layer for tungsten chemical vapor deposition fill in some cases. The boron layer may improve adherence between tungsten and silicon, the boron layer 20 may also improve tungsten adherence to dielectrics, such as silicon dioxide in some embodiments. In some embodiments, where the boron layer extends from the aperture walls to the metal fill material, the presence of titanium nitride in this region can be eliminated.

In some embodiments, the plug contact facilitates making electrical contact to a conductor such as doped region within the substrate 10. However the plug contact may be used for making any kind of contact in any application.

The contacts described herein may be used to form any integrated circuit. Examples of integrated circuits where such techniques may be useful include any memory, any logic device including a processor or controller, or any display device, to mention a few examples. Thus, the present application applies to any semiconductor apparatus, any integrated circuit, or any semiconductor device in general.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom, It is intended that the appended claims cover all such modifications and variations as fall within the true spirit and scope of this present invention.

What is claimed is:

1. An apparatus comprising:
a substrate with a contact;
a dielectric defining a via on the substrate, wherein the via is aligned with the contact;
a layer, consisting essentially of boron, coating an inside of the via; and
a metal filling the via.

2. The apparatus of claim 1, wherein the layer consisting essentially of boron is 50 Angstroms or less in thickness.

3. The apparatus of claim 1, wherein the layer consisting essentially of boron is free of titanium nitride.

4. The apparatus of claim 1, wherein the via has a high aspect ratio.

5. The apparatus of claim 1, wherein the metal is tungsten.

6. The apparatus of claim 1, wherein the layer consisting essentially of boron coats only the substrate and the contact.

7. A semiconductor device comprising:
a dielectric layer containing a via deposed on a substrate that includes a contact, wherein the via exposes the contact;
a layer, consisting, essentially of amorphous boron, covering the contact and substrate exposed by the via; and
a plug fill metal in the via.

8. The semiconductor device of claim 7, wherein the layer consisting essentially of amorphous boron is less than or equal to 50 Angstroms thick.

9. The semiconductor device of claim 7, wherein the plug fill metal is tungsten.

10. The semiconductor device of claim 7, wherein the layer consisting essentially of amorphous boron conformally coats an inside of the via.

11. The semiconductor device of claim 7, wherein the via has a high aspect ratio.

12. The semiconductor device of claim 7, wherein the layer consisting essentially of amorphous boron does not include any titanium nitride.

* * * * *

UNITED STATES PATENT AND TRADEMARK OFFICE
CERTIFICATE OF CORRECTION

| | | |
|---|---|---|
| PATENT NO. | : 8,810,033 B2 | Page 1 of 1 |
| APPLICATION NO. | : 13/890023 | |
| DATED | : August 19, 2014 | |
| INVENTOR(S) | : Rozenblat et al. | |

It is certified that error appears in the above-identified patent and that said Letters Patent is hereby corrected as shown below:

In the Claims

Column 4, line 39, Claim 7, delete "consisting," and insert -- consisting --, therefor.

Signed and Sealed this
Fourth Day of November, 2014

Michelle K. Lee
*Deputy Director of the United States Patent and Trademark Office*